(12) United States Patent
Radke

(10) Patent No.: US 8,725,937 B2
(45) Date of Patent: *May 13, 2014

(54) FAULT-TOLERANT NON-VOLATILE INTEGRATED CIRCUIT MEMORY

(75) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/556,593

(22) Filed: Jul. 24, 2012

(65) Prior Publication Data

US 2012/0290902 A1    Nov. 15, 2012

Related U.S. Application Data

(63) Continuation of application No. 13/154,150, filed on Jun. 6, 2011, now Pat. No. 8,234,439, which is a continuation of application No. 11/944,023, filed on Nov. 21, 2007, now Pat. No. 8,046,542.

(51) Int. Cl.
*G06F 12/00* (2006.01)

(52) U.S. Cl.
USPC ........................................... 711/103

(58) Field of Classification Search
None
See application file for complete search history.

(56) References Cited

U.S. PATENT DOCUMENTS

| 4,112,502 A | 9/1978 | Scheuneman |
| 5,942,004 A | 8/1999 | Cappelletti |
| 5,956,743 A | 9/1999 | Bruce et al. |
| 6,023,781 A | 2/2000 | Hazama |
| 6,279,133 B1 | 8/2001 | Vafai |
| 6,591,394 B2 | 7/2003 | Lee et al. |
| 6,628,723 B1 | 9/2003 | Gerlach et al. |
| 6,731,538 B2 | 5/2004 | Noda |
| 6,732,322 B1 | 5/2004 | Miyauchi et al. |
| 6,839,870 B2 | 1/2005 | Fanfelle |
| 6,871,303 B2 | 3/2005 | Halter |
| 6,895,543 B2 | 5/2005 | Hazama |
| 7,061,804 B2 | 6/2006 | Chun et al. |
| 7,184,356 B2 | 2/2007 | Noguchi et al. |
| 7,389,465 B2 | 6/2008 | Radke |

(Continued)

FOREIGN PATENT DOCUMENTS

| JP | 9-261081 | 10/1997 |
| JP | 2000-68862 | 3/2000 |

(Continued)

OTHER PUBLICATIONS

Dunscombe, et al., "Optimal Interleaving Scheme of Convolutional Coding", © 1989 Electronics Letters, V25, No. 22, p. 1517-1518.*

(Continued)

*Primary Examiner* — Brian Peugh
(74) *Attorney, Agent, or Firm* — Knobbe Martens Olson & Bear LLP

(57) ABSTRACT

Apparatus and methods are disclosed, such as those that store data in a plurality of non-volatile integrated circuit memory devices, such as NAND flash, with convolutional encoding. A relatively high code rate for the convolutional code consumes relatively little extra memory space. In one embodiment, the convolutional code is spread over portions of a plurality of memory devices, rather than being concentrated within a page of a particular memory device. In one embodiment, a code rate of m/n is used, and the convolutional code is stored across n memory devices.

12 Claims, 6 Drawing Sheets

(56) References Cited

U.S. PATENT DOCUMENTS

| | | | |
|---|---|---|---|
| 7,643,342 | B2 | 1/2010 | Litsyn et al. |
| 7,844,879 | B2 | 11/2010 | Ramamoorthy et al. |
| 7,904,780 | B2 | 3/2011 | Brandman |
| 2002/0120820 | A1 | 8/2002 | Higuchi et al. |
| 2003/0156454 | A1 | 8/2003 | Wei et al. |
| 2004/0022087 | A1 | 2/2004 | Satori |
| 2004/0268065 | A1 | 12/2004 | Hilton et al. |
| 2005/0114587 | A1 | 5/2005 | Chou et al. |
| 2006/0221752 | A1 | 10/2006 | Fasoli et al. |
| 2007/0061689 | A1 | 3/2007 | Park et al. |
| 2007/0124647 | A1 | 5/2007 | Chen et al. |
| 2007/0171714 | A1 | 7/2007 | Wu et al. |
| 2007/0171730 | A1 | 7/2007 | Ramamoorthy et al. |
| 2007/0266295 | A1 | 11/2007 | Conley |
| 2007/0266296 | A1 | 11/2007 | Conley |
| 2008/0137414 | A1 | 6/2008 | Park et al. |
| 2008/0163023 | A1 | 7/2008 | Hong et al. |
| 2008/0168319 | A1 | 7/2008 | Lee et al. |
| 2008/0320361 | A1 | 12/2008 | Fukuda et al. |
| 2009/0013233 | A1 | 1/2009 | Radke |
| 2009/0013234 | A1 | 1/2009 | Radke |
| 2009/0037627 | A1 | 2/2009 | Rofougaran |
| 2009/0100307 | A1 | 4/2009 | Lee |
| 2010/0023800 | A1 | 1/2010 | Harari et al. |
| 2010/0115376 | A1 | 5/2010 | Shalvi et al. |
| 2011/0060969 | A1 | 3/2011 | Ramamoorthy et al. |

FOREIGN PATENT DOCUMENTS

| | | |
|---|---|---|
| JP | 2000149592 | 5/2000 |
| JP | 2004-071012 | 3/2004 |
| KR | 100766042 | 10/2007 |
| WO | WO 2004062113 | 7/2004 |
| WO | WO 2006070668 | 7/2006 |
| WO | WO 2007084751 | 7/2007 |
| WO | WO 2008/069385 | 6/2008 |
| WO | WO 2008/078866 | 7/2008 |

OTHER PUBLICATIONS

Peleg, et. al., "On Interleaved, Differentially Encoded Convolutional Codes", © 1999, p. 1-27.*

Kong, et al., "Interleaved Convolutinal Code and Its Viterbi Decoder Architecture", © 2003 Hindawi Publishing Corporation, p. 1328-1334.*

European Patent Office; Extended European Search Report of Related European Application, Application No. 08851231.4; Mailing date Jan. 30, 2012.

European Patent Office; Extended European Search Report of related European Application, Application No. 08852229.7; Report issue date Nov. 22, 2011.

International search report mailed Dec. 29, 2008 in PCT Application No. PCT/US2008/068240.

International search report mailed Jan. 20, 2009 in PCT Application No. PCT/US2008/068236.

Korean Intellectual Property Office; "Notification of Transmittal of the International Search Report and the Written Opinion of the International Searching Authority, or the Declaration", "Written Opinion of the International Searching Authority", and "International Search Report" of related PCT application PCT/US/2008/081475, filed Oct. 28, 2008; mailed Feb. 18, 2009; Daejeon, Republic of Korea.

Korean Intellectual Property Office; "Notification of Transmittal of the International Search Report and the Written Opinion of the International Searching Authority, or the Declaration", "Written Opinion of the International Searching Authority", and "International search report" of corresponding International Application PCT/US2008/081743, filed Oct. 28, 2008; Dated Feb. 19, 2009; Daejeon, Republic of Korea.

The International Bureau of WIPO; International Preliminary Report on Patentability of related PCT Application No. PCT/US2008/068236, filed Jun. 25, 2008; mailing date Jan. 21, 2010; Geneva, Switzerland.

The International Bureau of WIPO; International Preliminary Report on Patentability of related PCT Application No. PCT/US2008/068240, filed Jun. 25, 2008; mailing date Jan. 21, 2010; Geneva, Switzerland.

USPTO; Office Action dated Apr. 12, 2011, from related U.S. Appl. No. 11/774,316, filed Jul. 6, 2007.

USPTO; Office Action dated Dec. 9, 2010, from related U.S. Appl. No. 11/944,023, filed Nov. 21, 2007.

USPTO; Office Action dated Dec. 9, 2011, from related U.S. Appl. No. 13/281,007, filed Oct. 25, 2011.

USPTO; Office Action dated Jan. 11, 2011, from related U.S. Appl. No. 11/774,377, filed Jul. 6, 2007.

USPTO; Office Action dated May 16, 2011, from related U.S. Appl. No. 11/774,377, filed Jul. 6, 2007.

USPTO; Office Action dated Nov. 30, 2011, from related U.S. Appl. No. 13/267,262, filed Oct. 6, 2011.

USPTO; Office Action dated Sep. 9, 2010, from related U.S. Appl. No. 11/944,023, filed Nov. 21, 2007.

Chinese Patent Office; Office Action dated Oct. 12, 2012, from related Chinese Patent Application No. 200880117049.8.

USPTO; Office Action dated Oct. 3, 2012, from related U.S. Appl. No. 13/570,180, filed Aug. 8, 2012.

Japanese Patent Office; Office Action dated Jun. 11, 2013, from related application Japanese Patent Application No. 2010-534994.

Japanese Patent Office; Office Action dated Jun. 11, 2013, from related application Japanese Patent Application No. 2010-534993.

European Patent Office; Extended Search Report of Related European Application 13156849.5-1960; Report issue date Jul. 12, 2013.

Japanese Patent Office; Office Action dated Oct. 8, 2013, from related application Japanese Patent Application No. 2010-534994.

* cited by examiner

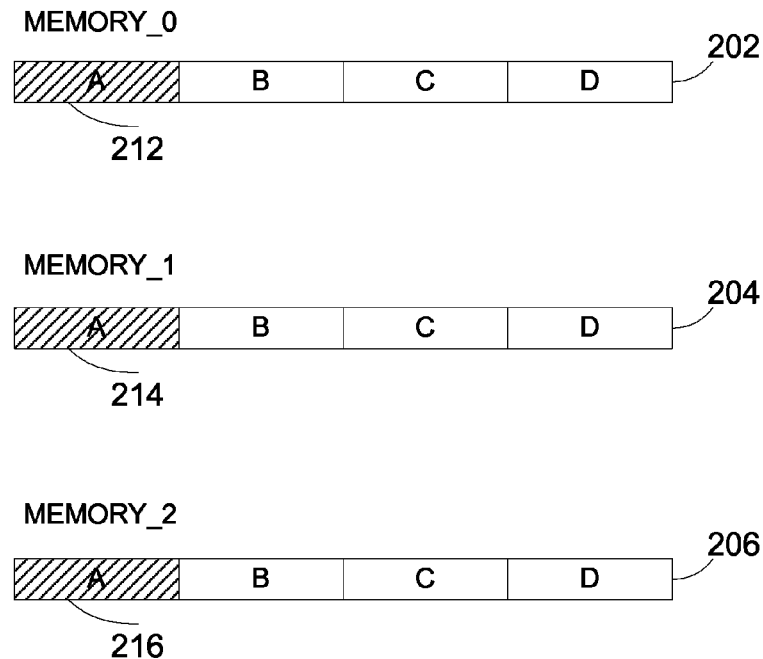
Fig. 2
Fig. 3

FAULT-TOLERANT NON-VOLATILE INTEGRATED CIRCUIT MEMORY

CROSS-REFERENCE TO RELATED APPLICATION

This application is a continuation application of U.S. application Ser. No. 13/154,150, filed Jun. 6, 2011, now U.S. Pat. No. 8,234,439, issued on Jul. 31, 2012, which is a continuation application of U.S. application Ser. No. 11/944,023, filed Nov. 21, 2007, now U.S. Pat. No. 8,046,542, the entireties of which are incorporated by reference herein.

BACKGROUND

1. Field of the Invention

Embodiments of the invention generally relate to solid-state memory. In particular, one or more embodiments of the invention relate to controllers for non-volatile integrated circuit memory circuits.

2. Description of the Related Art

Flash memory is a form of erasable and reprogrammable non-volatile integrated circuit memory. In a flash memory, memory cells are arranged in "blocks" for erasure. After a block has been erased, it is ready for programming if desired. NOR flash memory is a type of flash memory that offers access to individual bytes for retrieval of data, but has relatively low density. NAND flash memory is a type of flash memory that offers relatively high density. The high density is achieved in part by forming columns of cells connected in series. In addition, with NAND flash memory, data is programmed ("written") and accessed (read or write) in relatively large groups of bytes, such as a page of data.

A "page" of data typically refers to the amount of data that is typically written to and/or read from a NAND flash memory array at a single time. In one or more embodiments, such a page can correspond to a row or to a portion of a row in the NAND flash memory array. For example, a page can include 2,112 bytes, of which 2,048 are normal data bytes and 64 are spare bytes. The spare bytes are typically used for error correction code (ECC) data, wear-leveling information, or other overhead data. The use of error correction increases the robustness of the stored data. Typically, a form of error correction code (ECC) known as a block code is used to generate the error correction code data, such as cyclic redundancy check (CRC) checksums, Hamming codes, Reed-Solomon error correction, or the like. These error correction codes can be used to detect if there were errors in the read data bytes when read and can typically correct errors in the data bytes provided that the errors do not exceed the capability of the error correction code.

Flash memory has many uses. Examples include flash memory hard drives (replacements for hard drives), USB flash drives or thumb drives, mobile phones, digital cameras, digital media players, games, memory cards, navigation devices, personal digital assistants, computers, or the like. Within limits, the error correction codes can correct many errors in the data in the data bytes. However, beyond these limits, data with errors cannot typically be corrected. One disadvantage of conventional techniques is that by the time errors become uncorrectable, it is often too late to take measures to save the data.

Many of the devices that use flash memory for data storage also use an operating system. The operating system serves as an abstraction layer between hardware and other software. For example, a file system and a device driver of the operating system typically provide access to data stored on a memory device. There can be additional layers within an operating system.

FIG. 1 illustrates an example of a portion of a processing environment including a host 100, a memory controller 116, and non-volatile memory devices 106. The memory devices 106 can be NAND flash memory devices. The host 100 can include a microprocessor in the form of a CPU 102 and an operating system 104. The operating system 104 further includes a file system 108 and a device driver 110. It will be understood that the operating system 104 can have support for more than one file system and more than one device driver and other components not relevant to the present discussion.

The CPU 102 executes instructions, including the code of the operating system 104. The code of the file system 108 provides abstraction between low-level information, such as logical addresses for the memory devices 106, and high-level information, such as a file name and directory. The code for the device driver 110 typically handles low-level information for the data transfer to and from the memory devices 106. The device driver 110 can provide code for the CPU 102 to directly access the memory device 106 (known as processor input/output) or can provide code that activates the memory controller 116 to handle the bus control so that data is transferred to or available from the memory device 106. The use of the memory controller 116 frees up the CPU 102 to handle other tasks.

With processor input/output (PIO), the device driver 110 can handle ECC information associated with write operations and read operations. In many operating systems, many device drivers exist to support reading to and writing from various different types of memory devices. In addition to the mapping by the file system 108, many NAND flash memory devices utilize virtual mapping, which can be referred to as a flash translation layer, between logical addresses and physical addresses for bad block management and wear out management.

One technique that is commonly used with conventional hard disks used for data storage in conventional processing environments is known as a redundant array of inexpensive disks (RAID). In a RAID system, such as RAID-3, a redundant hard disk stores an exclusive-OR (XOR) of the other hard disks. For example, a third hard disk can contain an XOR of the contents of hard disks 1 and 2. Thus, if a hard disk catastrophically fails, the contents of the failed hard disk can be rebuilt from the remaining hard disks. However, if more than one hard disk fails catastrophically, the data cannot be rebuilt.

Catastrophic failures are not common, however, with solid-state non-volatile memory devices, such as NAND flash. Rather, solid-state non-volatile memory devices are more likely to suffer from individual bit errors.

BRIEF DESCRIPTION OF THE DRAWINGS

These drawings and the associated description herein are provided to illustrate specific embodiments of the invention and are not intended to be limiting.

FIG. 2 illustrates storage of convolutional code generated from two sectors worth of data spread over one sector apiece of pages of three memory devices.

FIG. 3 illustrates storage of convolutional code generated from two sectors worth of data written in effectively larger sectors of the memory devices.

DETAILED DESCRIPTION OF SPECIFIC EMBODIMENTS

Figure 1:
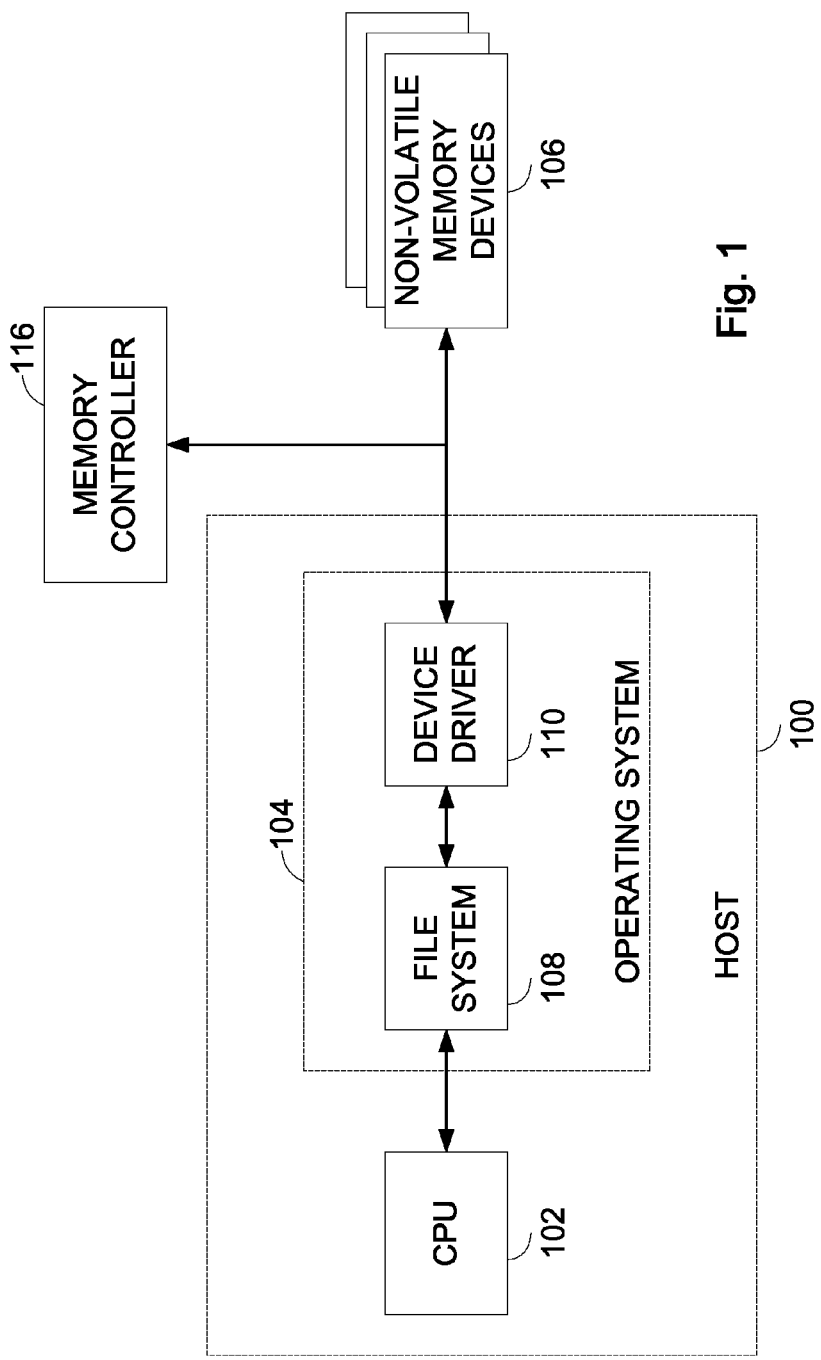
FIG. 1 illustrates a processing environment including a host, a controller, and non-volatile integrated circuit memory devices.

Apparatus and methods store data in a plurality of non-volatile integrated circuit memory devices with convolutional encoding. When data is encoded into a convolutional code, the resulting convolutional code is larger in size than the original data. A relatively high code rate for the convolutional code consumes relatively little extra memory. The code rate m/n of a convolutional code is a ratio of the number of information symbols m over the number of code symbols n. In one embodiment, the convolutional code is spread over portions of a plurality of memory devices, rather than being concentrated within a page of a particular memory device. In one embodiment, a code rate of m/n is used, and the convolutional code is stored across n memory devices. In one embodiment, the convolutional code is spread over the n memory devices by interleaving among the n memory devices.

Although particular embodiments are described herein, other embodiments of the invention, including embodiments that do not provide all of the benefits and features set forth herein, will be apparent to those of ordinary skill in the art.

In the context of conventional hard disk storage, a sector typically refers to the smallest amount of data, e.g., 512 bytes, that can be accessed when using conventional hard disks and diskettes, (the size of a sector can vary, e.g., a sector of an optical disk might be 2048 bytes). When such sectors of data are written to a non-volatile memory, the data in the sectors are typically supplemented with error correction code data. For example, 512 bytes of normal data can effectively grow to 528 bytes due to 16 bytes of ECC data. The number of bytes of ECC data can vary in a very large range depending on the desired strength of the ECC at the expense of storage capacity and decoding complexity. In addition, other data not pertinent to the current discussion can also be stored, and thus, the actual amount of memory allocated to a store a sector can vary.

With respect to file storage, the file system 108 (FIG. 1) groups data corresponding to one or more sectors into portions typically referred to as clusters. From the perspective of the file system, a cluster of data is the minimum size of data that can be allocated for the storage of a file. With certain types of memory devices, such as NAND flash memory, data is typically written to or read from the memory device a "page" at a time. A page can correspond to the data that can be stored in one or more sectors. A partial page write, that is, a programming of data to less than all of a page (e.g., writing to only a portion of a row can, in some embodiments, be considered a "partial" page write), is possible. To perform a partial page write, the bits of the portions of the page not being written to should remain the same state as the erased state, which is typically logic "1."

Embodiments of the invention spread convolutionally coded data over two or more non-volatile memory devices. FIG. 2 illustrates storage of convolutional coded data generated from 2 portions worth of non-convolutionally coded data spread over one portion apiece of pages of 3 memory devices. In one embodiment, a portion is a sector. FIG. 2 illustrates a page 202 of a first memory device (memory_0), a page 204 of a second memory device (memory_1), and a page 206 of third memory device (memory_2). In the illustrated embodiment, each of these pages 202, 204, 206 includes four portions, labeled A, B, C, and D. In the illustrated embodiment, each of the portions holds 528 bytes (with each of the pages holding 2112 bytes).

In the illustrated example, 1024 bytes of data (corresponding to two 512-byte sectors) from the host 100 (FIG. 1) are block encoded as two 528-byte "sectors." 1056 bytes are then convolutional encoded using a code rate m/n of 2/3 to generate 1584 bytes of convolutionally encoded data. In one example, the value of the denominator n of the code rate m/n is the same as the number of memory devices used. In one embodiment, the code rate m/n is selected such that n is equal to m+1. This makes the code rate m/n relatively high. For a convolutional code, the code rate m/n corresponds to the number of data bits m being encoded divided by the number of data bits after encoding n. Relatively high code rates can be generated from convolutionally encoded data by puncturing. For example, convolutionally encoded data with a code rate of 2/3 can be generated from convolutionally encoded data with a code rate of 1/2 (the "original convolutionally encoded data") by puncturing (e.g., removing) one out of every four bits of the original convolutionally encoded data according to a puncture pattern. An example of punctured convolutional code data will be described in greater detail later in connection with FIG. 5. Other suitable code rates and puncture patterns will be readily determined by one of ordinary skill in the art.

In one embodiment, the convolutionally encoded data corresponding to the two sectors is stored in the pages 202, 204, 206 of three memory devices 106 (FIG. 1). As illustrated, 528 bytes of the convolutionally encoded data are stored in portion A 212 of the page 202, another 528 bytes of the convolutionally encoded data are stored in portion A 214 of the page 204, and the remaining 528 bytes of the convolutionally encoded data are stored in portion A 216 of the page 206. The spreading of the encoded data over multiple memory devices 106 reduces the vulnerability of the data to an error in any one memory device.

FIG. 3 illustrates storage of the 1584 bytes of convolutionally encoded data in effectively larger portions (e.g., sectors) of the pages of the memory devices. For example, the portions can be increased in size by the inverse n/m of the code rate m/n. FIG. 3 depicts a page of data from each of three memory device 106 (FIG. 1). Instead of using, for example, 528-byte portions (as in the case of the embodiment discussed with respect to FIG. 2), at least some of the portions of the illustrated pages 302, 304, 306 are larger than 528 bytes. In the illustrated example, the code rate m/n of 2/3 remains the same, and the host 100 (FIG. 1) is again writing what the file system considers to be two 512-byte sectors of data, which, after block encoding corresponds to 528 bytes of data each, and after convolutional coding at a code rate m/n of 2/3, corresponds to 792-bytes each.

In the embodiment illustrated in FIG. 3, the portion size is increased relative to the portion size discussed with respect to the embodiment of FIG. 2, and the number of portions used to store the encoded data remains the same as the number of "sectors" of the original data (from the perspective of the file system). For example, instead of using three 528-byte portions as shown in FIG. 2, the convolutionally encoded data in FIG. 3 is stored in two 792-byte portions. As illustrated, the convolutionally encoded data is stored in two portions 310, 312 of the page 302 from one of the memory devices. The sectors 310, 312 are larger still than the 528-byte portions, e.g., 792 bytes, so that the number of sectors from the perspective of the host 100 (FIG. 1) and the number of portions from the perspective of all of the memory devices 106 (FIG. 1) remains the same. Data corresponding to some of the sectors can be spread over two pages, each from a different one of the memory devices 106. For example, the data corresponding to what the file system considers a sector C can be spread over the page 302 of memory_0 and the page 304 from memory_1 as indicated by portions $C_0$ and $C_1$. One benefit of storing data in the fashion illustrated in FIG. 3 is that the data bus for the memory devices can have less width, as the writing can be confined to one memory device 106 (FIG. 1) at a time. However, the configuration illustrated in FIG. 2 will typically be faster if the configuration of memory devices of FIG. 2 are set up with a wider data bus width for parallel data transfer.

Figure 4:
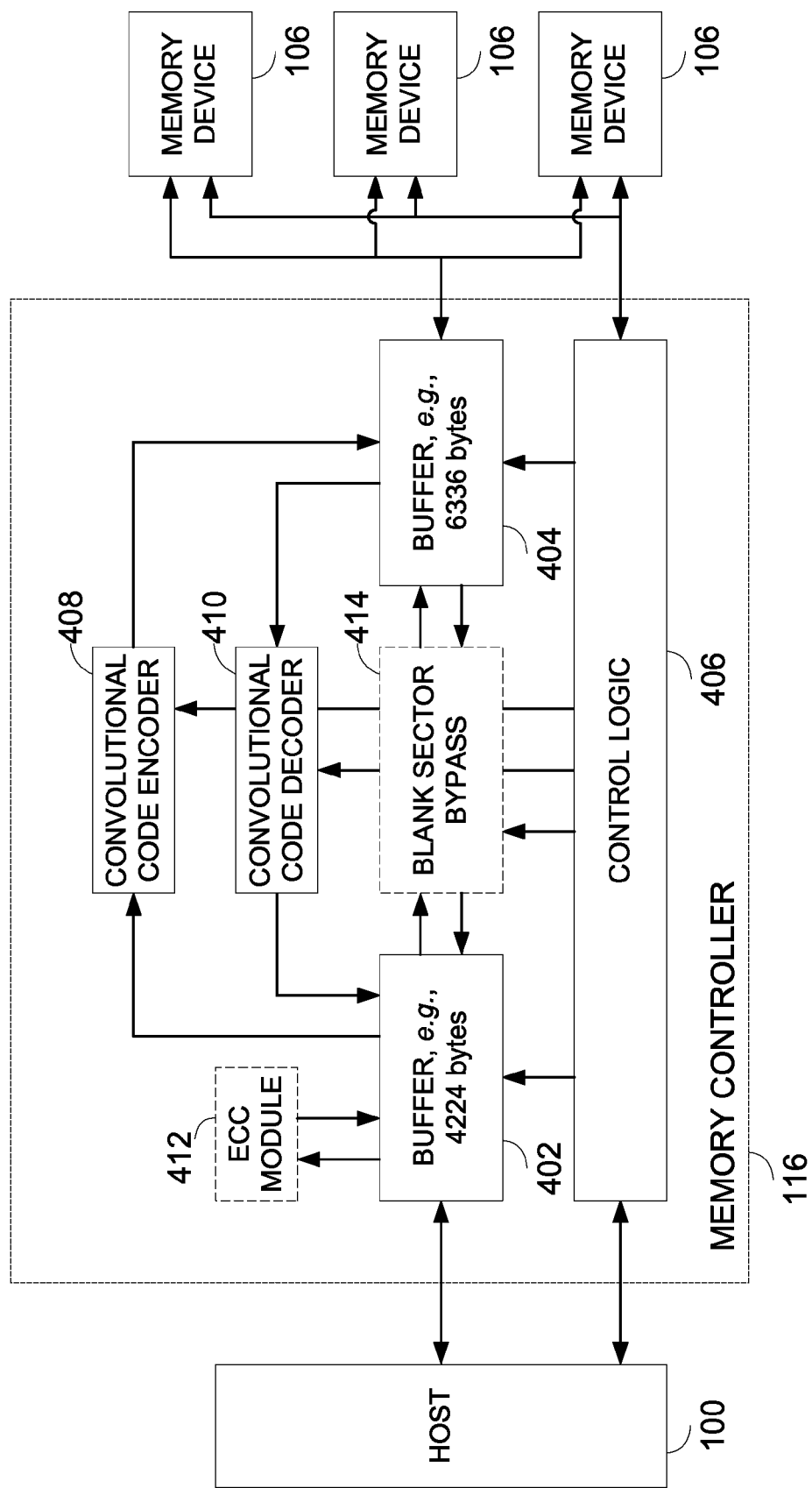
FIG. 4 schematically illustrates an example of a memory controller.

FIG. 4 schematically illustrates an example with further details of the memory controller 116 (FIG. 1). In the illustrated embodiment, the memory controller 116 is configured to interface with NAND flash memory devices 106 (FIG. 1). The memory controller 116 can be implemented by hardware or by firmware/software, or by a combination of both hardware and firmware. The memory controller 116 can be a part of the host 100, such as part of software or firmware executed by the CPU 102 (FIG. 1), can be part of a separate chip, such as a direct memory access (DMA) controller, part of a module with a plurality of memory devices, or the like.

The memory controller 116 includes a first buffer 402, a second buffer 404, control logic 406, a convolutional code encoder 408, and a convolutional code decoder 410. An error correction code module 412 and a blank sector bypass module 414 can also be employed. For ease of interface, the memory controller 116 can provide the host 100 with the appearance that the memory controller 116 and memory devices 106 are storing data in a conventional manner such that the convolutional encoding and solid-state memory devices are transparent to the host 100. For example, with a code rate of 2/3 and the use of 3 memory devices 106, the memory controller 116 can provide the host 100 with the appearance that the host 100 is communicating with a conventional hard disk drive. This can assist in compatibility with many systems.

These systems can include computer systems with operating systems such as Windows® or DOS, USB interfaces, memory cards, and the like. It can be desirable for the memory controller 116 to provide an interface for the host 100 that mimics a hard disk drive. In one embodiment, rather than mimic a hard disk drive, the memory controller 116 provides access to the memory devices 106 via memory addressing.

When, for example, a file is saved in a processing environment operating an operating system, the number of pages of data used to store the data can be related to the number of clusters used to hold the data in disk storage, rather than to the size of the data itself. Accordingly, when a write initiated by the host 100 only covers a portion of a page of a memory device, the memory controller 116 can perform a partial page write. For example, in a typical NAND Flash device, memory bits are "erased" to a logic "1" state. During programming, selected bits are written to a logic "0" state (bits cannot be written to a logic "1" state except via an erase operation for the whole block). Portions of pages (e.g., portions of rows of a memory array) that are not intended to be written should be left erased or with the previous programming, which preserves the prior state of those portions.

To accomplish this, in one or more embodiments, the first buffer 402 temporarily stores data for transfer to or from the host 100. The first buffer 402 is typically implemented in hardware. The file system 108 (FIG. 1) may access data for reads or writes in clusters. The cluster size can vary and in some operating systems can be configurable by an end user. The memory devices 106 provide access to data in pages. The page size can vary among different types of devices, but is typically not user configurable.

In the illustrated embodiment, the host 100 reads or writes a cluster of two 512-byte sectors at a time. Accordingly, the first buffer 402 should be at least 1024 bytes in size. However, the cluster size can vary. The sector size can vary as well. For example, including block ECC data and other spare data, a sector of data from the perspective of a file system can correspond to 528 bytes. The amount of ECC data can also vary. In addition, additional memory devices 106 can be present depending on configuration, buffers for holding computations can also be present, and separate buffers for input and output can be used. Accordingly, the size of the first buffer 402 can vary and can be larger than needed for a specific task.

For a memory controller 116 interfacing with three memory devices 106 each having a page size of four sectors and with an embodiment using a code rate of 2/3, the memory controller 116 can provide the host 100 with the appearance that the host 100 is interfacing with eight sectors of hard disk storage. In this example, the first buffer 402 should hold at least eight sectors (e.g., 4224 bytes). Other examples will be readily determined by one of ordinary skill in the art.

The second buffer 404 temporarily stores data for transfer to or from the memory devices 106. The second buffer 404 is typically implemented in hardware. In the illustrated example, each of the memory devices 106 has a page having four portions of 528 bytes each. The second buffer 404 should be at least 6336 bytes in size to accommodate data to or from the memory devices 106. The size of the second buffer 404 can vary according to whether separate buffers are used for reads and writes, the size of the page of the memory devices 106, the number of memory devices 106, and the like.

The control logic 406 provides general control of the memory controller, provides an interface for address lines between the host 100 and the memory devices 106, provides control signals for the host 100 and/or the memory devices 106, and the like. In one embodiment, the control logic 406 can also control the operation of the convolutional code encoder 408, the convolutional code decoder 410, the block encoding of the ECC module 412, and the blank sector bypass module 414. The control logic 406 can be implemented by hardware, by software, or by a combination of both hardware and software.

The convolutional code encoder 408 retrieves data from the first buffer 402 and convolutionally encodes the data. The convolutionally encoded code is then stored in the second buffer 404. The convolutional code encoder 408 can be implemented by either hardware, by software, or by a combination of both hardware and software. In one embodiment, the convolutional code encoder 408 has a selectable code rate m/n and/or a selectable puncture pattern. This provides flexibility in convolutionally encoding the data appropriate for a relatively wide broad range of numbers of memory devices 106. For example, in one embodiment, there are n memory devices, and the code rate is selected so that m is equal to n+1. The convolutionally encoded data stored in the second buffer 404 is then stored in the memory devices 106. For example, the control logic 406 can provide the addressing and control signals for the data transfer. When the host 100 requests a read of data, the corresponding convolutionally encoded data is retrieved from the memory devices 106 and stored in the second buffer 404.

The convolutional code decoder 410 decodes the convolutionally encoded data stored in the second buffer 404. The decoded data is stored in the first buffer 402. In one embodiment, the convolutional code decoder 410 is a Viterbi decoder. The convolutional code decoder 410 can also include an insertion circuit that inserts "dummy" data or uses erasure pointers as applicable to compensate for bits that had been punctured (removed). In one embodiment, when the convolutional code decoder 410 encounters the dummy data or the erasure pointer, the convolutional code decoder 410 does not rely on the that data for decoding.

The error correction code (ECC) module 412 and the blank sector bypass module 414 of the illustrated embodiment will now be described. The ECC module 412 generates block code data, such as for forward error correction (FEC) code data of the data to be stored. The original data with the block code data will be referred to hereafter as "block-encoded data." The ECC module 412 can be implemented by either hardware or software, or by a combination of both. For example, block encoding is a task that can be performed by a microprocessor. For writing of data from the host 100 to the memory devices 106, the ECC module 412 reads the data in the first buffer 402, computes the block codes and stores the block-encoded data in the first buffer 402. The block-encoded data is then convolutional encoded and stored in the memory devices 106. The block encoding by the ECC module 412 permit errors to be detected and errors to be corrected (within the limitations of the error correction code) when the data is later retrieved.

In a conventional system incorporating Flash memory, a partial page write can be accommodated. In a typical Flash memory (NAND or NOR), data is erased to a logic "1" and selectively written during write cycles to logic "0" as applicable. Typical error correction code data for a blank portion of a page, e.g., a portion that is all logic "1," are also all logic "1," and do not overwrite the erased state of an unprogrammed portion of a page or the other spare data for the page. However, after convolutional encoding, blank data that was previously all logic "1" will be encoded as various logic "1" and "0" states, which would overwrite the erased state of an unprogrammed portion of a page. Thus, programming the convolutionally encoded data would overwrite the erased state. In one embodiment, the memory controller 116 detects portions of pages that should be left unprogrammed and bypasses the convolutional encoding for those portions. This can be determined by, for example, the sector size and inspection of the contents of the first buffer 402.

In the illustrated embodiment, a blank sector bypass module 414 detects blank sectors and skips convolutional encoding or decoding. The blank sector bypass module 414 can be implemented by hardware, by software, or by a combination of both. When a partial page write is being performed on one or more of the memory devices 106, the portions of the page(s) that are not being programmed should be left in their erased, e.g., logic "1," state. For example, for a byte of data, all logic "1" for the bits is "1111 1111" in binary notation or "FF" in hexadecimal notation. Accordingly, the blank sector bypass module 414 writes logic "1" states to the second buffer 404 as appropriate to preserve the ability to program the remaining portions of the page in the future, as subsequently "writing" logic "1" (no actual write occurs) to the Flash memory devices will preserve the previous state, whether erased at logic "1" or programmed to "0" of the contents of the page. The cache or page registers for the memory devices can also be filled with logic "1" with memory writes that do not use the second buffer 404. The blank sector bypass module 414 can also prevent the overwriting of previously programmed data. For example, with reference to FIG. 2, if no data is to be written to the portions labeled B, C, and D, the second buffer 404 can be filled with logic "1" to maintain the previous erased or programmed state of those portions.

When data is being read from the memory devices 106, the blank sector bypass module 414 can similarly detect the presence of one or more blank portions of pages of the memory devices 106 and bypass the convolutional code decoding for those portions of pages. In one embodiment, the blank sector bypass module 414 determines a portion is blank by the formatting, e.g., allocation of amounts of data to portions, and by the presence of all "1" in corresponding memory space of the second buffer 404. The blank sector bypass module 414 can then, for example, write all "1" in the corresponding portion of the first buffer 402. Of course, the buffers 402, 404 can also be written with all "1" first, and then overwritten as appropriate with convolutionally encoded data prior to transfer to the memory devices 106 (FIG. 1) or overwritten with decoded convolutional code data prior to retrieval by the host 100 (FIG. 1).

Figure 5:
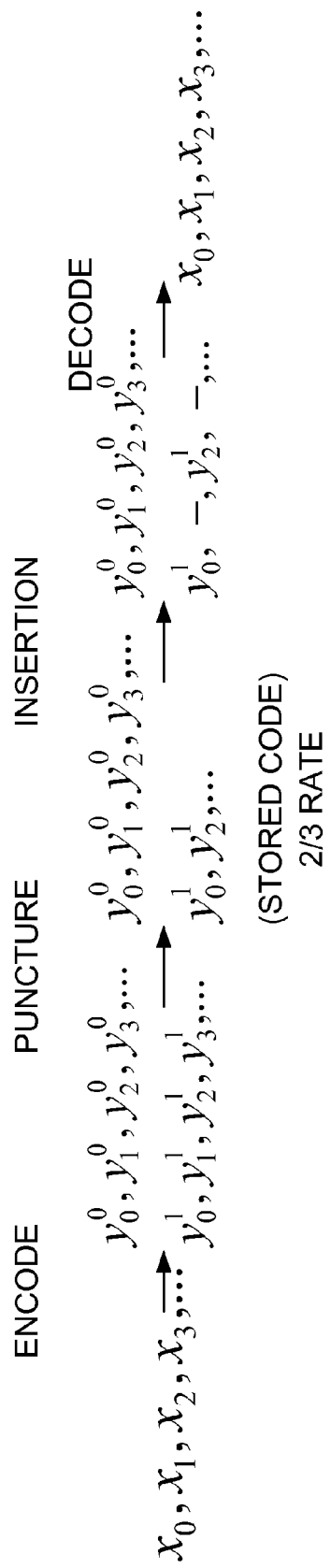
FIG. 5 schematically illustrates a data flow for puncturing a convolutional code.

FIG. 5 schematically illustrates data flows for puncturing convolutionally encoded data that initially has a code rate of 1/2 to generate a convolutionally encoded data having a code rate of 2/3. For example, with reference to FIG. 4, the data flows can correspond to a path from the first buffer 402, through the convolutional code encoder 408, the second buffer 404, storage in, and then subsequent retrieval from the memory devices 106, the second buffer 404, the convolutional code decoder 410, and to the first buffer 402.

The data stream $x_0, x_1, x_2, x_3, \ldots$ is illustrated convolutional encoded without puncturing to generate two output data, e.g., (bit) streams $y_0^0, y_1^0, y_2^0, y_3^0, \ldots$ and $y_0^1, y_1^1, y_2^1, y_3^1, \ldots$ which are then punctured to $y_0^0, y_1^0, y_2^0, y_3^0, \ldots$ and $y_0^1, y_2^1, \ldots$, which are then stored in the memory devices 106.

For a data read, the punctured data $y_0^0, y_1^0, y_2^0, y_3^0, \ldots$ and $y_0^1, y_2^1, \ldots$ is retrieved from the memory devices 106. Erasure pointers (represented by dashes) indicate the erasures for the decoder, and the punctured data with indicated erasures $y_0^0, y_1^0, y_2^0, y_3^0, \ldots$ and $y_0^1, -, y_2^1, -, \ldots$ are decoded by the convolutional code decoder 410 to decode back to the original data stream $x_0, x_1, x_2, x_3, \ldots$. The redundancy of the forward error correction should provide correct decoding of the original data stream even with erasures and even with some errors. Further error correction can be provided by decoding in accordance with block error correction codes.

Figure 6:
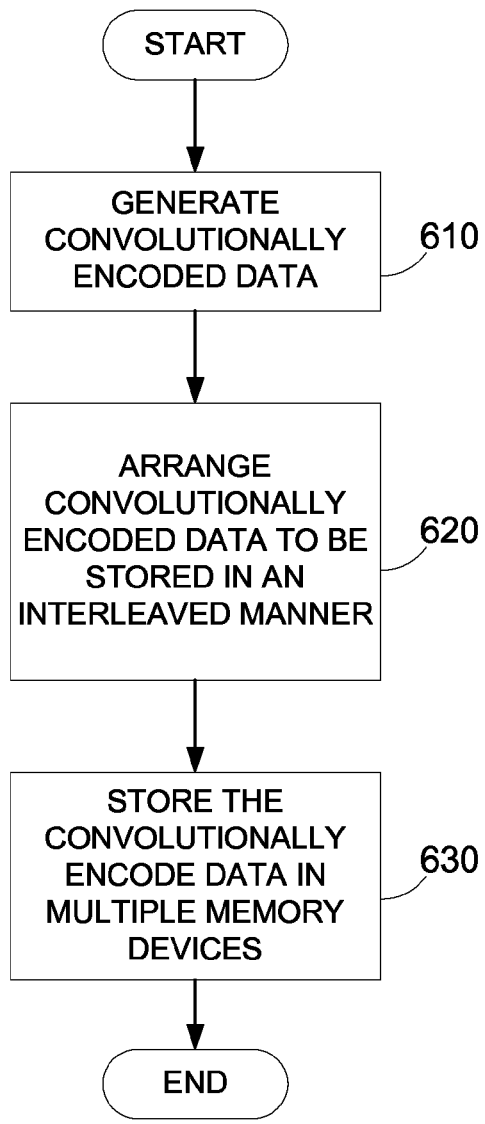
FIG. 6 is a flowchart generally illustrating an embodiment of a process for writing data to the non-volatile integrated circuit memory devices.

FIG. 6 is a flowchart generally illustrating an embodiment of a process for writing data to the non-volatile integrated circuit memory devices. For example, the process can be executed by a microprocessor or a controller. It will be appreciated by the skilled practitioner that the illustrated process can be modified in a variety of ways. For example, in another embodiment, various portions of the illustrated process can be combined, can be rearranged in an alternate sequence, can be removed, and the like. The process illustrated in FIG. 6 can be used to store data in the format shown in FIG. 2, e.g., with stored data spread over multiple memory devices. At the start of the process, it is assumed that data has already been loaded into the first buffer 402 (FIG. 4) by the host 100 (FIG. 1 or 4), and that the data has been block encoded.

The process begins by convolutional encoding 610 data (e.g., original data that has been block encoded). For example, data (e.g., block encoded data) can be convolutionally encoded to generate convolutionally encoded data having a relatively low code rate, and convolutionally encoded data having a relatively high code rate can be generated from the low-rate convolutionally encoded data by puncturing as illustrated earlier in connection with FIG. 5.

In one embodiment, to spread the convolutionally encoded data (punctured or not), it is arranged 620 when stored in the second buffer 404 such that it will be stored in at least two portions, e.g., one portion of a page in each of at least two different memory devices 106 (FIG. 1 or 4) in an interleaved manner. In another embodiment, the convolutionally encoded data is arranged 620 when it is copied from the second buffer 404 to the corresponding page buffers of the memory devices 106. The convolutionally encoded data can be arranged so that, when stored, it is written to a portion of a page of a first memory device, portion of a page of a second memory device, and so on. In one embodiment, the storage among the devices alternates to spread the stored data over the devices. For example, as illustrated in FIG. 2, the convolutionally encoded data is stored in portions 212, 214, 216 of three different memory devices.

The process then proceeds to store 630 the convolutionally encoded data in the memory devices 106 (FIG. 1 or 4). For example, the data can be transferred to a cache or buffer within the memory devices 106, and then a command to store the loaded pages can be sent to the memory devices 106. When partial page writes are performed, the portions of the pages that are not being written should be left in the same state as the erased state, e.g., logic "1" for typical Flash devices.

In one embodiment, a convolutional encoding having a code rate m/n is selected based on the number of memory devices 106 (FIG. 1 or 4). For example, the number of memory devices 106 can be used to determine n of the convolutional code. In one embodiment, the n of the convolutional code is selected to be equal to the number of memory devices. Then, for the same size sectors, m sectors of block-encoded data are convolutionally encoded and stored in n memory devices. Of course, with a multiple of m sectors of block-encoded data, e.g., 2m sectors, more than one portion of a page per memory device can be used for storing the convolutionally encoded data. In one embodiment, the m for the code rate is equal to n+1 for an efficiently high code rate. In one embodiment, the m corresponds to a number of sectors in a cluster of a file system.

Figure 7:
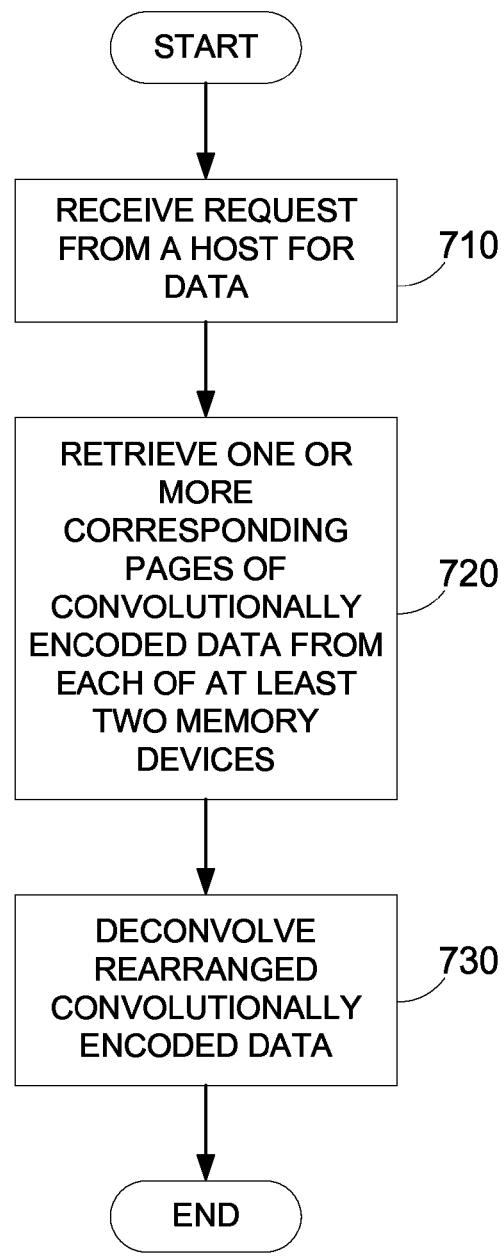
FIG. 7 is a flowchart generally illustrating an embodiment of a process for reading data from the non-volatile integrated circuit memory devices.

FIG. 7 is a flowchart generally illustrating an embodiment of a process for reading data from the non-volatile integrated circuit memory devices. It will be appreciated by the skilled practitioner that the illustrated process can be modified in a variety of ways. For example, in another embodiment, various portions of the illustrated process can be combined, can be rearranged in an alternate sequence, can be removed, and the like. The process illustrated in FIG. 6 can be used to read data organized as shown in FIG. 2. At the start of the process, it is assumed that convolutionally encoded data has been stored for retrieval in multiple memory devices 106 (FIG. 1 or 4).

The process begins by receiving a request 710 from the host 100 (FIG. 1 or 4) for data. For example, the device driver 110 (FIG. 1) can request one or more "sectors" of data. The process retrieves 720 one or more corresponding pages of convolutionally encoded data from two or more memory devices 106 (FIG. 1 or 4). For example, the pages of convolutionally encoded data can then be stored in the second buffer 404 (FIG. 4).

The process then deconvolves 730 the convolutionally encoded data. The convolutionally encoded data is read from either the second buffer 404 or from the memory devices 106 for decoding, also known as deconvolving. Deconvolving 730 can include insertion of "dummy" data or erasure pointers to replace or compensate for data previously punctured and can be performed in accordance with a Viterbi algorithm. For deconvolving, the convolutionally encoded data is rearranged from the normal order of reading data of the second buffer 404 or from the memory devices 106 to restore the original order of the convolutionally encoded data. For example, if the convolutionally encoded data is spread over one page of each of three different memory devices, rather than arrange the page data from each memory device page by page, the convolutionally encoded data is reconstructed by arranging the data back into the order in which it was originally written. Block decoding can further be used to detect and/or correct errors.

One embodiment is a method of storing data in a plurality of non-volatile integrated circuit memory devices, wherein the method includes: convolutionally encoding data; and storing the convolutionally encoded data such that the convolutionally encoded data is interleavingly spread over at least two non-volatile integrated circuit memory devices.

One embodiment is a method of reading data from a plurality of non-volatile integrated circuit memory devices, wherein the method includes: retrieving convolutionally encoded data from at least two non-volatile integrated circuit memory devices, wherein the convolutionally encoded data is spread over the at least two non-volatile integrated circuit memory devices; and deconvolving the convolutionally encoded data retrieved from the memory devices, wherein deconvolving comprises rearranging the convolutional encoded data to restore an original order of the convolutional encoded data.

One embodiment is a method of storing data in a plurality non-volatile integrated circuit memory devices, wherein the method includes: convolutional encoding m first-size portions of data into m second-size portions of convolutional code using a code rate of m/n, wherein the second-size portions are n/m times larger than the first-size sectors, wherein at least one of the m first-size portions contains actual data as opposed to blank data; and storing the m second-size portions of convolutional code in n non-volatile integrated circuit memory devices, wherein the m non-volatile integrated circuit memory devices are configured to store m first-size portions, wherein n is at least two.

One embodiment is a method of accessing data from a plurality of non-volatile integrated circuit memory devices, wherein the method includes: receiving a request from a host for data; retrieving one or more associated sectors of data from at least one of two or more of the non-volatile integrated circuit memory devices, wherein the one or more associated sectors are of a first sector size; and deconvolving at least a portion of the one or more associated sectors to generate one or more sectors of information related to at least portion of the requested page, wherein the one or more sectors of the generated information are of a second sector size smaller than the first sector size by a code rate of a convolutional code that is deconvolved, wherein the sectors of generated information are read for deconvolving one page after another from the non-volatile integrated circuit memory devices.

One embodiment is an apparatus, wherein the apparatus includes: a first buffer; a second buffer; control logic configured to interface between a host and a plurality of non-volatile integrated circuit memory devices and to control the storage of data from the second buffer to the non-volatile integrated circuit memory devices such that data is interleavingly spread over the non-volatile integrated circuit memory devices; a convolutional code encoder configured to encode data stored in the first buffer and to store the encoded data in the second buffer for transfer to the non-volatile integrated circuit memory devices; and a convolutional code decoder configured to decode data stored in the second buffer retrieved from the non-volatile integrated circuit memory devices and to store the decoded data in the first buffer.

Various embodiments have been described above. Although described with reference to these specific embodiments, the descriptions are intended to be illustrative and are not intended to be limiting. Various modifications and applications may occur to those skilled in the art.

I claim:

1. A method of storing data in a plurality of non-volatile integrated circuit memory devices, the method comprising:
  convolutionally encoding data;
  storing the convolutionally encoded data such that the convolutionally encoded data is interleavingly spread over the at least two non-volatile integrated circuit memory devices; and
  basing a code rate m/n for the convolutional encoding at least partly on a number of non-volatile integrated circuit memory devices over which data is spread, wherein the number is at least two.

2. The method of claim 1, wherein:
  convolutionally encoding comprises convolutionally encoding data corresponding to at least m sectors of block-encoded data, wherein m/n corresponds to a code rate of the convolutional code; and
  storing comprises storing the convolutionally encoded data in n non-volatile integrated circuit memory devices.

3. The method of claim 2, further comprising:
  receiving unencoded data corresponding to m sectors from a host; and
  block encoding the m sectors of unencoded data to generate the m sectors of block-encoded data.

4. The method of claim 2, wherein m sectors corresponds to a number of sectors in a cluster according to a file system.

5. A method of reading data from a plurality of non-volatile integrated circuit memory devices, the method comprising:
  retrieving convolutionally encoded data from at least two non-volatile integrated circuit memory devices, wherein the convolutionally encoded data is spread over the at least two non-volatile integrated circuit memory devices; and
  deconvolving the convolutionally encoded data retrieved from the memory devices, wherein deconvolving comprises:
    rearranging the convolutional encoded data to restore an original order of the convolutional encoded data and basing a code rate m/n for deconvolving at least partly on the number of non-volatile integrated circuit memory devices over which the convolutionally encoded data is spread.

6. The method of claim 5, further comprising receiving a request from a host for a cluster of data corresponding to the retrieved convolutional encoded data prior to retrieving.

7. The method of claim 5, further comprising block decoding the deconvolved data.

8. A method of storing data in a plurality non-volatile integrated circuit memory devices, the method comprising:
  convolutional encoding m first-size portions of data into m second-size portions of convolutional code using a code rate of m/n, wherein the second-size portions are n/m times larger than the first-size sectors, wherein at least one of the m first-size portions contains actual data as opposed to blank data;
  basing a characteristic of convolutional encoding at least partly on a number n of non-volatile integrated circuit memory devices over which the convolutionally encoded data is to be spread; and
  storing the m second-size portions of convolutional code in the n non-volatile integrated circuit memory devices, wherein the m non-volatile integrated circuit memory devices are configured to store m first-size portions, wherein n is at least two.

9. The method of claim 8, further comprising block encoding the data prior to convolutional encoding.

10. A method of accessing data from a plurality of non-volatile integrated circuit memory devices, the method comprising:
  receiving a request from a host for data;
  retrieving one or more associated sectors of data from at least one of two or more of the non-volatile integrated circuit memory devices, wherein the one or more associated sectors are of a first sector size; and
  deconvolving at least a portion of the one or more associated sectors to generate one or more sectors of information related to at least portion of the requested page, wherein the one or more sectors of the generated information are of a second sector size smaller than the first sector size by a code rate of a convolutional code that is deconvolved, wherein the sectors of generated information are read for deconvolving one page after another from the non-volatile integrated circuit memory devices, wherein a characteristic for deconvolving is based at least partly on the number of non-volatile integrated circuit memory devices over which convolutionally encoded data to be deconvolved is stored, wherein the number is at least two.

11. The method of claim 10, wherein receiving the request from the host comprises receiving a request from the host for a cluster of data.

12. The method of claim 10, further comprising decoding block codes from the generated information to generate the requested data.

* * * * *